(12) United States Patent
Otani et al.

(10) Patent No.: US 12,031,692 B2
(45) Date of Patent: Jul. 9, 2024

(54) VEHICLE LIGHT-FIXTURE

(71) Applicant: Ichikoh Industries, Ltd., Isehara (JP)

(72) Inventors: Ayako Otani, Isehara (JP); Masataka Nakagawa, Isehara (JP); Hironari Zushi, Isehara (JP)

(73) Assignee: Ichikoh Industries, Ltd., Isehara (JP)

( * ) Notice: Subject to any disclaimer, the term of this patent is extended or adjusted under 35 U.S.C. 154(b) by 0 days.

(21) Appl. No.: 17/289,945

(22) PCT Filed: Oct. 31, 2019

(86) PCT No.: PCT/JP2019/042795
§ 371 (c)(1),
(2) Date: Apr. 29, 2021

(87) PCT Pub. No.: WO2020/090980
PCT Pub. Date: May 7, 2020

(65) Prior Publication Data
US 2022/0010941 A1    Jan. 13, 2022

(30) Foreign Application Priority Data
Oct. 31, 2018    (JP) .................. 2018-205413

(51) Int. Cl.
*F21S 43/13*        (2018.01)
*B60Q 1/26*         (2006.01)
(Continued)

(52) U.S. Cl.
CPC .............. *F21S 43/13* (2018.01); *B60Q 1/268* (2013.01); *B60Q 1/302* (2013.01); *F21S 43/145* (2018.01); *H10K 50/805* (2023.02)

(58) Field of Classification Search
CPC . F21S 43/145; F21Y 2115/15; F21Y 2115/20; B60Q 1/268; B60Q 1/302;
(Continued)

(56) References Cited

U.S. PATENT DOCUMENTS

| 7,048,422 | B1 * | 5/2006 | Solomon | B60Q 1/50 |
| | | | | 345/76 |
| 2001/0053082 | A1 * | 12/2001 | Chipalkatti | B60Q 1/26 |
| | | | | 362/496 |

(Continued)

FOREIGN PATENT DOCUMENTS

| DE | 10 2009 005 558 A1 | 7/2010 |
| DE | 20 2013 103 655 U1 | 9/2013 |

(Continued)

OTHER PUBLICATIONS

Machine translation of JP-2013118074-A retrieved from ESPACENET. (Year: 2022).*

(Continued)

*Primary Examiner* — Colin J Cattanach
(74) *Attorney, Agent, or Firm* — Oblon, McClelland, Maier & Neustadt, L.L.P.

(57) ABSTRACT

A vehicle light fixture includes: one light source including a light emitting layer partitioned into a plurality of segments capable of emitting light individually; and a control unit for causing the light emitting layer to emit light in a different light emitting state by performing control of selecting the segment for emitting light from among the plurality of segments, and control of at least one of brightness and a light emission timing of the selected segment.

9 Claims, 8 Drawing Sheets

(51) Int. Cl.
  *B60Q 1/30* (2006.01)
  *F21S 43/145* (2018.01)
  *H10K 50/805* (2023.01)
(58) Field of Classification Search
  CPC .. B60Q 3/208; H10K 59/00; H10K 59/80521; H10K 59/80515; H10K 50/813; H10K 50/822
  See application file for complete search history.

(56) References Cited

U.S. PATENT DOCUMENTS

| | | | |
|---|---|---|---|
| 2005/0024197 A1* | 2/2005 | Cheng | B60Q 1/2665 340/475 |
| 2005/0030735 A1 | 2/2005 | Wang | |
| 2005/0062597 A1* | 3/2005 | Su | B60Q 1/50 340/475 |
| 2005/0073851 A1* | 4/2005 | Itoh | B32B 17/10788 362/487 |
| 2011/0157893 A1* | 6/2011 | Ngai | F21S 8/06 362/249.02 |
| 2014/0003072 A1* | 1/2014 | Yamamoto | B60J 5/107 362/503 |
| 2015/0138817 A1* | 5/2015 | Salter | F21S 41/176 362/510 |
| 2015/0375673 A1* | 12/2015 | Testai | B60Q 1/268 362/545 |
| 2017/0066372 A1 | 3/2017 | Ruat et al. | |
| 2018/0334087 A1* | 11/2018 | Salter | B60Q 1/0035 |
| 2019/0157602 A1* | 5/2019 | Nakamura | H01L 51/5237 |
| 2019/0323674 A1* | 10/2019 | Chikama | B60Q 1/2607 |
| 2020/0091466 A1* | 3/2020 | Yoshida | B60Q 1/0035 |

FOREIGN PATENT DOCUMENTS

| | | | | |
|---|---|---|---|---|
| DE | 20 2014 101 538 U1 | 5/2014 | | |
| EP | 1234752 A1 * | 8/2002 | | B62D 29/04 |
| JP | 2001100698 A * | 4/2001 | | G09G 3/3216 |
| JP | 2003-112570 A | 4/2003 | | |
| JP | 2005-75349 A | 3/2005 | | |
| JP | 2005-283940 A | 10/2005 | | |
| JP | 2013-118074 A | 6/2013 | | |
| JP | 2013118074 A * | 6/2013 | | |
| JP | 2014-8877 A | 1/2014 | | |
| JP | 2015-195173 A | 11/2015 | | |
| JP | 2015-215995 A | 12/2015 | | |
| WO | WO 2017/103428 A1 | 6/2017 | | |
| WO | WO-2017089946 A2 * | 6/2017 | | F21S 43/237 |
| WO | WO 2017/187913 A1 | 11/2017 | | |

OTHER PUBLICATIONS

Machine translation of JP 2001100698 A retrieved from the FIT database of PE2E search. (Year: 2023).*

International Search Report issued Dec. 17, 2019 in PCT/JP2019/042795 filed Oct. 31, 2019, citing documents AA-Ab and AP-AS therein, 2 pages.

Extended European Search Report issued Apr. 20, 2022, in Application No. 19 879 187.3, citing documents AA, AB, and AO-AT therein, 8 pages.

Combined Office Action and Search Report issued on Aug. 30, 2023 in Chinese Patent Application No. 201980071675.6, citing reference 15 therein, 9 pages.

* cited by examiner

VEHICLE LIGHT-FIXTURE

TECHNICAL FIELD

The present invention relates to a vehicle light fixture.

BACKGROUND ART

As a vehicle light fixture, a combination lamp in which a plurality of functional lamps such as a tail lamp, a stop lamp, and a turn lamp are integrated is known (for example, see Patent Literature 1).

CITATION LIST

Patent Literature

PTL 1: Japanese Unexamined Patent Application Publication No. 2015-215995

SUMMARY OF THE INVENTION

Problems to be Solved by the Invention

In a vehicle light fixture as described above, there is a need for making the entirety of the light fixture compact and lightweight.

An object of the present disclosure is to provide a vehicle light fixture capable of being made compact and lightweight.

Means for Solving the Problem

A vehicle light fixture according to the present disclosure includes: one light source including a light emitting layer partitioned into a plurality of segments capable of emitting light individually; and a control unit for causing the light emitting layer to emit light in a different light emitting state by performing control of selecting the segment for emitting light from among the plurality of segments, and control of at least one of a brightness and a light emission timing of the selected segment.

Further, the light emitting layer may be formed by using an organic electroluminescence material.

Further, the light source may be disposed in an area along an outer periphery of a rear window of a vehicle, and the plurality of segments may be partitioned to align in an outer peripheral direction being a direction in which the outer periphery of the rear window extends.

Further, the light source may include an electrode for supplying electric power to the light emitting layer, and the electrode may include an outer peripheral electrode disposed on an outer peripheral side of the rear window with respect to the light emitting layer in an extending state in the outer peripheral direction.

Further, the electrode may include a segment electrode disposed in association with the segment, and the segment electrode may include a connecting portion extending toward the outer peripheral electrode and connected to the outer peripheral electrode.

Further, the light emitting layer may include an area in which two of the segments are disposed side by side in a direction intersecting the outer peripheral direction, the segment electrode may include a first segment electrode disposed in association with one of the two segments in the area, and a second segment electrode disposed in association with the other segment, the connecting portion of the first segment electrode may be disposed at one end of the first segment electrode in the outer peripheral direction, and the connecting portion of the second segment electrode may be disposed at an other end of the second segment electrode in the outer peripheral direction.

Further, the rear window may include a gradation area in which a hue of a vehicle gradually decreases from the outer periphery toward an inside, and the light emitting layer may be formed in such a way that a light emission amount gradually decreases from the outer periphery of the rear window toward an inside in association with the gradation area.

Further, the vehicle light fixture may further include a light shielding portion for covering an area of the light source where the light emitting layer is formed, when viewed from a driver's seat of a vehicle.

Effect of the Invention

The present disclosure is able to provide a vehicle light fixture capable of being made compact and lightweight.

MODE FOR CARRYING OUT THE INVENTION

In the following, an embodiment of a vehicle light fixture is described with reference to the drawings. The present invention is not limited to this embodiment. In addition, components in the following embodiment include those that can be easily replaced by those skilled in the art, or those that are substantially the same. In the following description, each of a front-rear direction, an up-down direction, and a left-right direction is a direction in a vehicle-mounted state in which a vehicle headlamp is mounted on a vehicle, and indicates a direction when a traveling direction of the vehicle is viewed from a driver's seat. In the present embodiment, it is assumed that the up-down direction is in parallel to a vertical direction, and the left-right direction is a horizontal direction.

Figure 1:
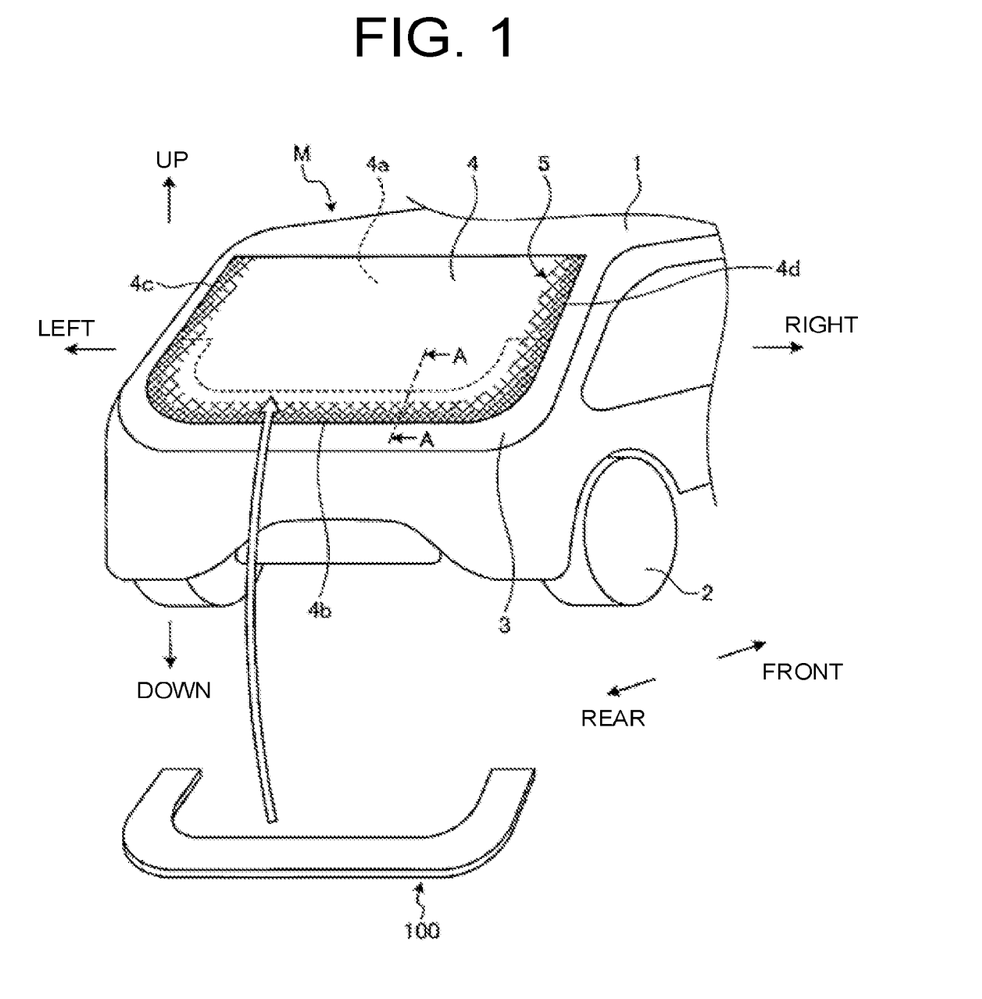
FIG. 1 is a perspective view showing one example of a vehicle according to the present embodiment.

FIG. 1 is a perspective view showing one example of a vehicle M according to the present embodiment, and shows a state in which the vehicle M is viewed from the rear side. The vehicle M includes a vehicle body 1, a traveling device 2, and a vehicle light fixture 100.

The vehicle body 1 is supported by the traveling device 2, and includes a rear door 3. The rear door 3 is formed by using, for example, a steel plate, an aluminum plate, or the like. The rear door 3 is provided with a rear window 4. The rear window 4 is formed by using, for example, glass or the like. The rear door 3 and the rear window 4 are formed by assembling, for example, the rear door 3 and the rear window 4 as individual members. The rear window 4 has, for example, a rectangular shape with rounded corners. In the rear window 4, a gradation area 5 is formed on an outer peripheral portion thereof, specifically, on a left side, a right side, and a lower side of the rear window 4 in a vehicle-mounted state. The gradation area 5 is formed in such a way that a hue of the vehicle body 1 gradually decreases from the outer peripheral portion of the rear window 4 toward the inside, when viewed from the rear side of the vehicle.

The vehicle light fixture 100 is attached to a surface 4a of the rear window 4 on a vehicle window side. The vehicle light fixture 100 is disposed in an area along the outer periphery of the rear window 4 of the vehicle M. For example, the vehicle light fixture 100 is disposed in an area along a lower side 4b of the rear window 4, and has a shape extending along the lower side 4b. The vehicle light fixture 100 has a shape in which both ends in the left-right direction are curved from the lower side 4b toward a left side 4c and a right side 4d.

The vehicle light fixture 100 has a plurality of functions such as a tail lamp that turns on in association with turning on of a head lamp, a stop lamp that turns on in association with an operation of a brake device, a rear turn signal lamp that turns on to indicate a traveling direction of the vehicle M, a welcome lamp that turns on when a door of the vehicle M is unlocked, and the like.

Figure 2:
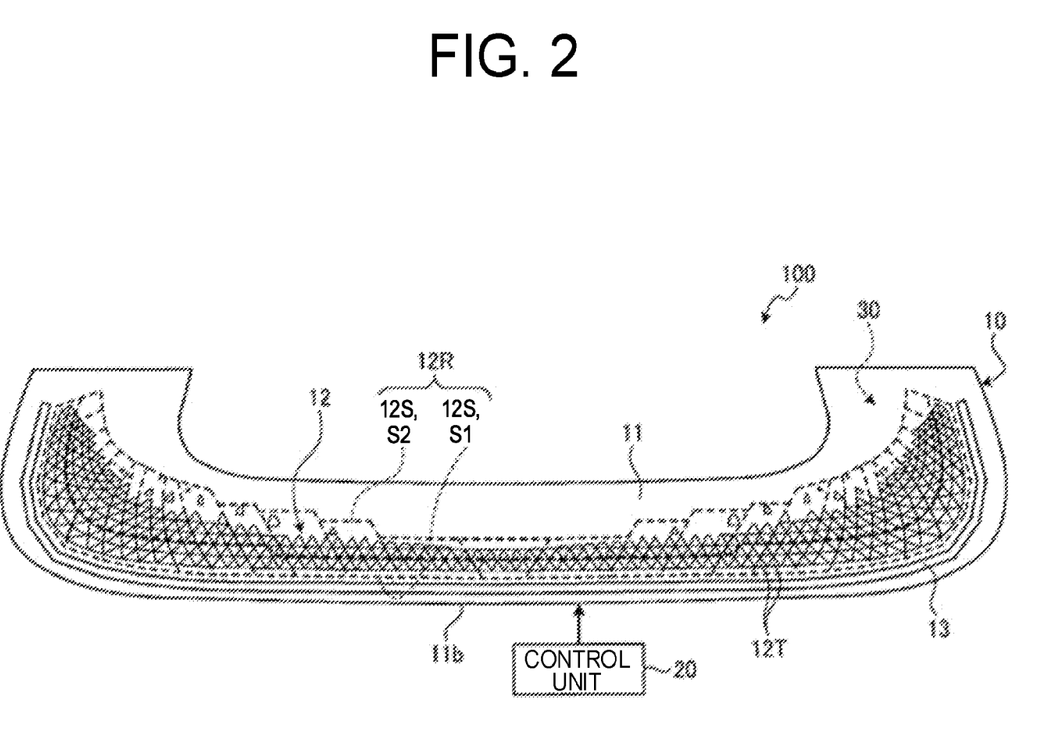
FIG. 2 is a front view showing one example of a vehicle light fixture according to the present embodiment.
Figure 3:
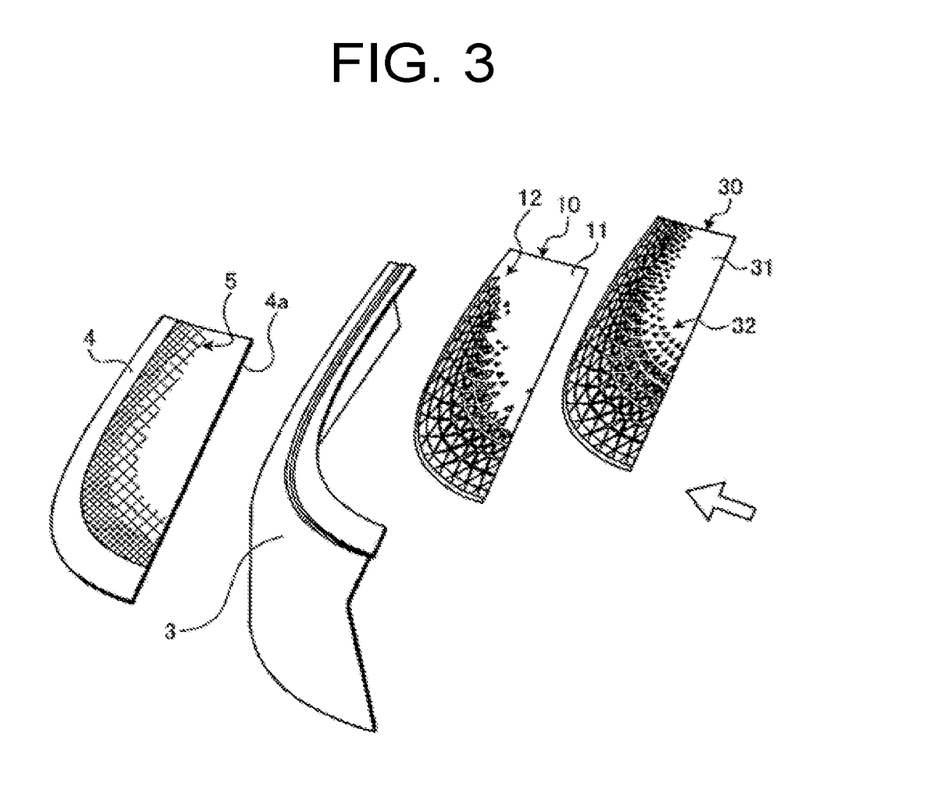
FIG. 3 is a perspective view showing a partial configuration of the vehicle light fixture.
Figure 4:
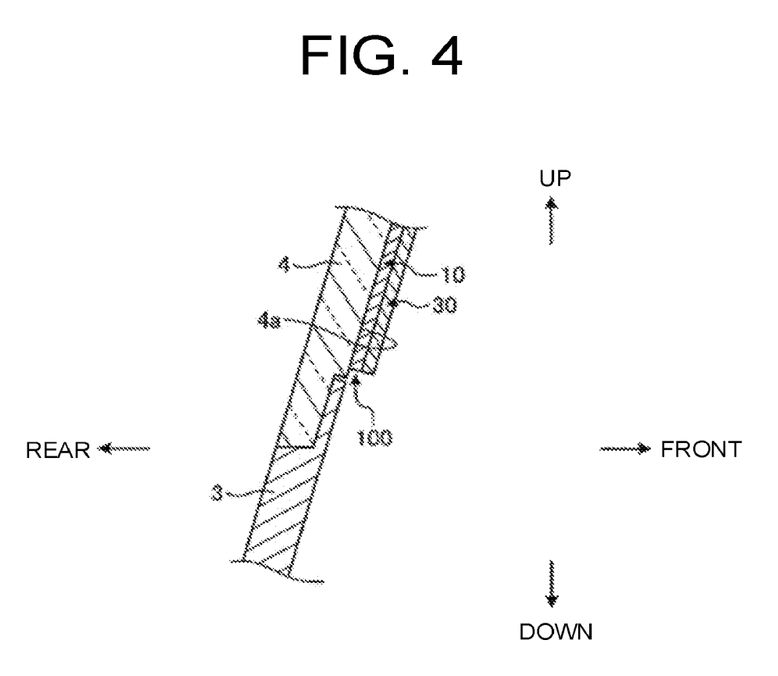
FIG. 4 is a cross-sectional view showing a state viewed from the direction of the arrow in FIG. 3.

FIG. 2 is a front view showing one example of the vehicle light fixture 100 according to the present embodiment. FIG. 3 is a perspective view showing a partial configuration of the vehicle light fixture 100. FIG. 4 is a cross-sectional view showing a state viewed from the direction of the arrow in FIG. 3. As shown in FIGS. 2 to 4, the vehicle light fixture 100 includes a light source 10, a control unit 20, and a light shielding portion 30.

The light source 10 includes a base portion 11, a light emitting layer 12, and an electrode 13. The base portion 11 has a plate shape, and supports the light emitting layer 12 and the electrode 13. The base portion 11 has a shape along the lower side 4b, the left side 4c, and the right side 4d of the rear window 4. The light emitting layer 12 is formed by using, for example, an organic electroluminescence material.

The light emitting layer 12 is formed into a band-shaped area along the outer periphery of the rear window 4. The light emitting layer 12 includes a plurality of unit light emitting layers 12T. The unit light emitting layer 12T is formed into a triangular shape, for example, but is not limited to this, and may be formed into another shape such as a circular shape, an elliptical shape, or another polygonal shape.

The light emitting layer 12 is formed in such a way that a light emission amount gradually decreases from the outer periphery of the rear window 4 toward the inside in association with the gradation area 5 of the rear window 4. In this case, the light emitting layer 12 is formed in such a way that the area of the unit light emitting layer 12T gradually decreases, for example, from the outer peripheral portion of the rear window 4 toward the inside. Further, the light emitting layer 12 is formed in such a way that a distance between the adjacent unit light emitting layers 12T gradually increases, for example, from the outer peripheral portion of the rear window 4 toward the inside. Thus, the light emitting layer 12 is formed in such a way that a light amount gradually decreases from the outer peripheral portion of the rear window 4 toward the inside in association with the gradation area 5, thereby improving the appearance.

The light emitting layer 12 includes a plurality of light emitting areas 12R. The plurality of light emitting areas 12R are disposed to align in a direction (hereinafter, referred to as an "outer peripheral direction") in which the outer periphery of the rear window 4 extends. Each of the light emitting areas 12R is divided into a plurality of segments 12S capable of emitting light individually. In this way, the light emitting layer 12 is partitioned into the segments 12S in such a way that the plurality of light emitting areas 12R include the plurality of segments 12S. Each of the segments 12S is set in a range including the plurality of unit light emitting layers 12T.

In the present embodiment, each of the light emitting areas 12R includes two segments 12S. The two segments 12S in each of the light emitting areas 12R are disposed side by side in a direction intersecting the outer peripheral direction. The two segments 12S in each of the light emitting areas 12R may differ in shape and area. Hereinafter, the segment 12S on a side closer to the outer periphery of the rear window 4, of the two segments 12S, may be referred to as a first segment S1, and the other segment 12S may be referred to as a second segment S2.

The electrode 13 supplies electric power to the light emitting layer 12. The electrode 13 includes an outer peripheral electrode 14 and a segment electrode 15. The outer peripheral electrode 14 is connected to, for example, an unillustrated power supply unit, an unillustrated control unit 20, and the like. The outer peripheral electrode 14 is disposed on the outer peripheral side of the rear window 4 with respect to the light emitting layer 12 in an extending state in the outer peripheral direction. For example, the outer peripheral electrode 14 is disposed along an end edge 11b of the base portion 11 on a side of the lower side 4b of the rear window 4. When viewed from the rear side of the vehicle M, the outer peripheral electrode 14 is hidden by, for example, the rear door 3 or another opaque member, and cannot be seen from the outside of the vehicle M. The outer peripheral electrode 14 extends along the end edge 11b of the base portion 11. Disposing the outer peripheral electrode 14 along the end edge 11b on the side of the lower side 4b of the rear window 4 makes it possible to connect the outer peripheral electrode 14 to the vehicle body 1 without complicating a routing configuration of the outer peripheral electrode 14. Further, since the outer peripheral electrode 14 is provided along the outer peripheral shape of the rear window 4 on which the vehicle light fixture 100 is disposed, the outer peripheral electrode 14 can be made inconspicuous.

Figure 5:
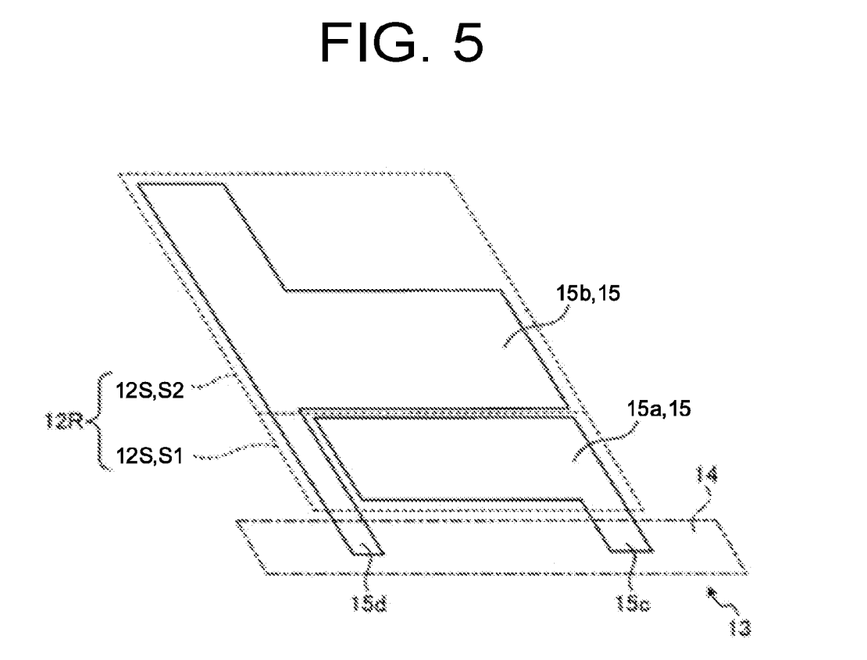
FIG. 5 is a diagram schematically showing one light emitting area.

The segment electrode 15 is disposed in association with the segment 12S. FIG. 5 is a diagram schematically showing one light emitting area. The segment electrode 15 includes a first segment electrode 15a disposed in association with the first segment S1, and a second segment electrode 15b disposed in association with the second segment S2. In other words, an area where the segment electrode 15 is provided can be set as the segment 12S. Specifically, an area where the first segment electrode 15a is provided can be set as the first segment S1, and an area where the second segment electrode 15b is provided can be set as the second segment S2.

The first segment electrode 15a and the second segment electrode 15b include connecting portions 15c and 15d, respectively. The connecting portion 15c extends from the first segment electrode 15a toward the outer peripheral electrode 14, and is connected to the outer peripheral electrode 14. Further, the connecting portion 15d extends from the second segment electrode 15b toward the outer peripheral electrode 14, and is connected to the outer peripheral electrode 14.

The connecting portion 15c of the first segment electrode 15a is disposed at one end of the first segment electrode 15a in the outer peripheral direction. Further, the connecting portion 15d of the second segment electrode 15b is disposed at the other end of the second segment electrode 15b in the outer peripheral direction. This makes it possible to effectively utilize a space at a central portion in the light emitting area 121i, as the first segment S1 and the second segment S2.

Figure 6:
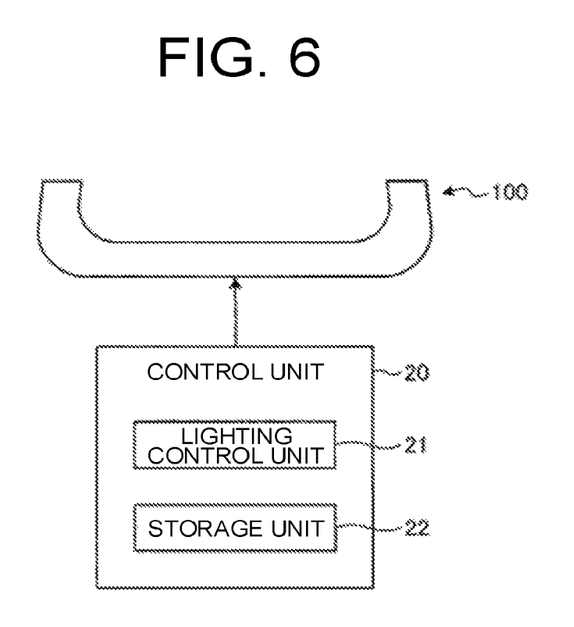
FIG. 6 is a block diagram showing one example of a control unit.

FIG. 6 is a block diagram showing one example of the control unit 20. As shown in FIG. 6, the control unit 20 includes a lighting control unit 21 and a storage unit 22. The lighting control unit 21 controls a lighting state of the light emitting layer 12. The lighting control unit 21 causes the light emitting layer 12 to emit light in a different light emitting state by performing control of selecting a segment 12S for emitting light from among the plurality of segments 12S, and control of at least one of a brightness and a light emission timing of the selected segment 12S.

The storage unit 22 stores a program, data, and the like related to an operation of the vehicle light fixture 100. For example, the storage unit 22 stores data related to a light emitting state of the light emitting layer 12. The data related to the light emitting state include, for example, target data about a segment 12S for emitting light, brightness data related to a brightness of the segment 12S, and timing data related to a light emission timing of the segment 12S. These pieces of the target data, the brightness data, and the timing data are set in each light emitting state. When the light emitting layer 12 is caused to emit light in a predetermined light emitting state, the lighting control unit 21 controls the light emitting state of the light emitting layer 12 by using the associated target data, brightness data, and timing data.

The light shielding portion 30 is provided to cover an area of the light source 10 where the light emitting layer 12 is formed, when viewed from the driver's seat of the vehicle M. The light shielding portion 30 includes a base portion 31 and a light shielding pattern 32. The base portion 31 has a plate shape having a shape associated with the lower side 4b, the left side 4c, and the right side 4d of the rear window 4, and is capable of transmitting light generated in the light emitting layer 12. The light shielding pattern 32 is formed in association with a pattern of the light emitting layer 12, and blocks light generated in the light emitting layer 12. Forming the light shielding portion 30 prevents the light generated in the light emitting layer 12 from being irradiated toward the driver's seat.

Figure 7:
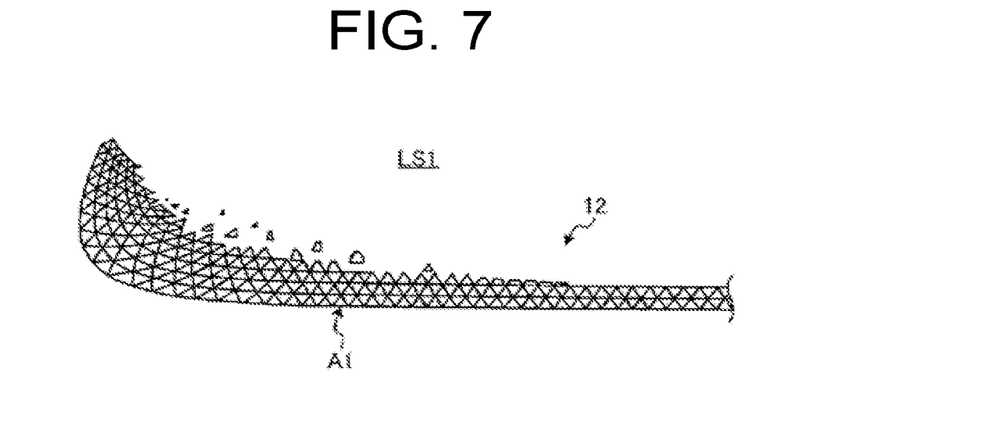
FIG. 7 is a diagram showing one example of a light emitting state of a light emitting layer.

FIGS. 7 to 10 are diagrams showing one example of a light emitting state of the light emitting layer 12. As shown in FIG. 7, for example, the lighting control unit 21 can form a light emitting state LS1 by causing the entirety of the light emitting layer 12 to emit light with a predetermined brightness. In this case, the lighting control unit 21 controls all the segments 12S to emit light, and controls all the segments 12S to emit light with a same brightness and at a same timing. In the light emitting state LS1, the entirety of the light emitting layer 12 becomes a lighting area A1.

Figure 8:
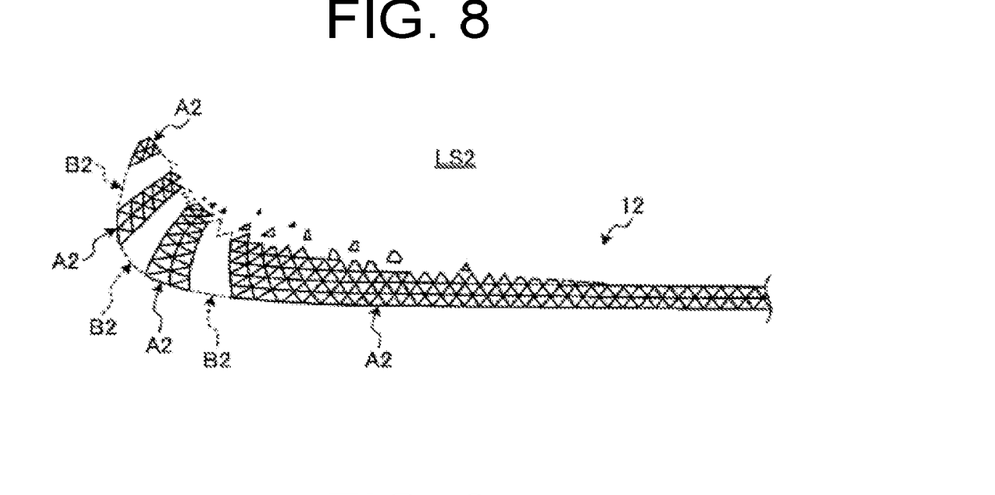
FIG. 8 is a diagram showing one example of a light emitting state of the light emitting layer.

Further, the lighting control unit 21 can form a light emitting state LS2 including a lighting area A2 and an off area B2, as shown in FIG. 8, for example, by turning off, from the light emitting state LS1, an area of the light emitting layer 12 associated with a part of the segments 12S. In this case, the lighting control unit 21 selects again a segment 12S for emitting light, and controls the selected segment 12S to emit light with the same brightness and at the same timing. In the example shown in FIG. 8, a case where light is turned off in each of the light emitting areas 12R is described as an example. However, the present invention is not limited to the above. One of the segments 12S in the light emitting area 12R may be set as the lighting area A2, and the other segment 12S may be set as the off area B2.

Figure 9:
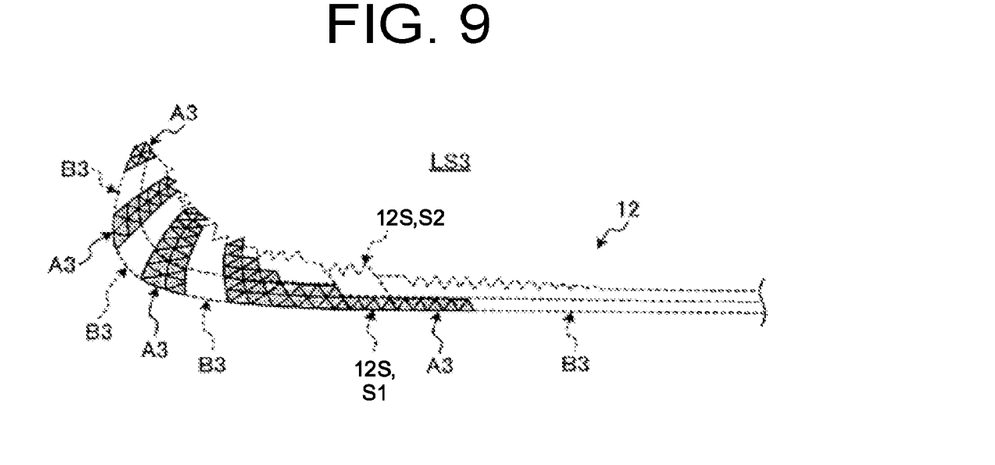
FIG. 9 is a diagram showing one example of a light emitting state of the light emitting layer.

Further, the lighting control unit 21 can form a light emitting state LS3 including a lighting area A3 in a brighter state than the light emitting states LS1 and LS2, and an off area B3, as shown in FIG. 9, by increasing, from the light emitting state LS2, a light emission amount of a part of the segments 12S, and turning off a part of the segments 12S. In this case, the lighting control unit 21 selects again the segment 12S for emitting light, sets the selected segment 12S to have a brightness higher than that in the light emitting state LS2, and controls the selected segment 12S to emit light at a same timing. In the light emitting state LS3, there is a light emitting area 12R in which one of the segments 12S serves as the lighting area A3, and the other segment 12S serves as the off area B3. In this way, adjusting a light emitting state for each of the segment 12S makes it possible to form a wider variety of light emitting states.

Figure 10:
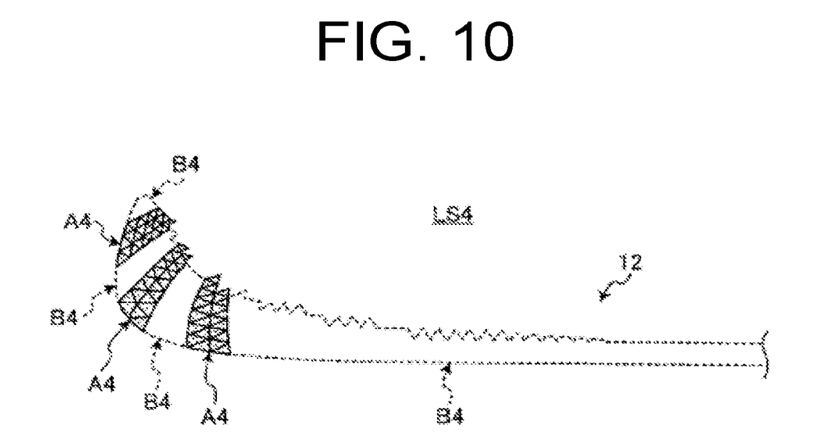
FIG. 10 is a diagram showing one example of a light emitting state of the light emitting layer.

Further, the lighting control unit 21 can form a light emitting state LS4 in which a lighting area and an off area are reversed with respect to the light emitting state LS2, as shown in FIG. 10, for example, by turning off the lighting area A2 in a lighting state, and turning on the off area B2 in an off state in the light emitting state LS2. In this case, the lighting control unit 21 selects only a segment 12S that is not selected in the light emitting state LS2, and controls the selected segment 12S to emit light with a same brightness and at a same timing. A lighting area A4 in the light emitting state LS4 is equivalent to the off area B2 in the light emitting state LS2. Further, an off area B4 in the light emitting state LS4 is equivalent to the lighting area A2 in the light emitting state LS2.

Regarding the light emitting states LS1 to LS4 formed in this way, when the segments are caused to emit light as a welcome lamp, the light emitting state LS1 can be set, when the segments are caused to emit light as a tail lamp, the light emitting state LS2 can be set, when the segments are caused to emit light as a stop lamp, the light emitting state LS3 can be set, and when the segments are caused to emit light as a rear turn signal lamp, the light emitting state LS4 can be set. The correlation between each of the light emitting states LS1 to LS4 and the lamp function is not limited to the above, and other combinations may be applied.

As described above, the vehicle light fixture 100 according to the present embodiment includes the one light source 10 including the light emitting layer 12 partitioned into the plurality of segments 12S capable of emitting light individually, and the control unit 20 for causing the light emitting layer 12 to emit light in a different light emitting state by performing control of selecting a segment 12S for emitting light from among the plurality of segments 12S, and controlling at least one of a brightness and a light emission timing of the selected segment 12S.

In this configuration, the vehicle light fixture 100 can form a plurality of light emitting states associated with a plurality of functional lamps by the one light source 10. Thus, it is not necessary to individually mount structures associated with a plurality of functional lamps, and the vehicle light fixture 100 can be made compact and lightweight.

In the vehicle light fixture 100 according to the present embodiment, the light emitting layer 12 is formed by using an organic electroluminescence material. Thus, a plurality of light emitting states associated with a plurality of functional lamps can be easily formed by the one light source 10. Further, since the light emitting layer 12 can be formed thin, it is possible to select a position where the vehicle light fixture 100 is mounted from a wide range.

In the vehicle light fixture 100 according to the present embodiment, the light source 10 is disposed in an area along the outer periphery of the rear window 4 of the vehicle M, and the plurality of segments 12S are partitioned to align in the outer peripheral direction. Thus, since a light emitting state changes in the outer peripheral direction, different light emitting states can be easily distinguished one from another. Further, in a case where the vehicle light fixture 100 is disposed in an area along the outer periphery of the rear window 4, it is possible to provide a function as a light fixture, while securing a field of view on the rear side of the vehicle from the driver's seat.

In the vehicle light fixture 100 according to the present embodiment, the light source 10 includes the electrode 13 for supplying electric power to the light emitting layer 12, and the electrode 13 includes the outer peripheral electrode 14 disposed on the outer peripheral side of the rear window 4 with respect to the light emitting layer 12 in an extending state along the outer periphery of the rear window 4. Disposing the outer peripheral electrode 14 in an extending state along the outer periphery of the rear window 4 as described above makes it possible to connect the outer peripheral electrode 14 to a power supply unit on the side of the rear door 3 without complicating a routing configuration of the outer peripheral electrode 14.

In the vehicle light fixture 100 according to the present embodiment, the electrode 13 includes the segment electrode 15 disposed in association with the segment 12S, and the segment electrode 15 includes the connecting portions 15c and 15d extending toward the outer peripheral electrode 14 and connected to the outer peripheral electrode 14. This makes it possible to prevent a routing configuration of the electrode 13 from becoming complicated.

In the vehicle light fixture 100 according to the present embodiment, the light emitting layer 12 includes the light emitting area 12R in which two segments 12S are disposed side by side in a direction intersecting the outer peripheral direction. The segment electrode 15 includes the first segment electrode 15a disposed in association with the first segment S1 of the two segments 12S in the light emitting area 12R, and the second segment electrode 15b disposed in association with the second segment S2. The connecting portion 15c of the first segment electrode 15a is disposed at one end of the first segment electrode 15a in the outer peripheral direction, and the connecting portion 15d of the second segment electrode 15b is disposed at the other end of the second segment electrode 15b in the outer peripheral direction. This makes it possible to effectively utilize a space at a central portion in the light emitting area 12R, as the first segment S1 and the second segment S2.

In the vehicle light fixture 100 according to the present embodiment, the rear window 4 includes the gradation area 5 in which a hue of the vehicle M gradually decreases from the outer periphery toward the inside, and the light emitting layer 12 is formed in such a way that a light emission amount gradually decreases from the outer periphery of the rear window 4 toward the inside in association with the gradation area 5. This makes it possible to form a light emitting state having gradations associated with the gradation area 5 without performing complicated control at the time of causing the light emitting layer 12 to emit light, and improve the appearance.

The vehicle light fixture 100 according to the present embodiment further includes the light shielding portion 30 for covering an area of the light source 10 where the light emitting layer 12 is formed, when viewed from the driver's seat of the vehicle. This makes it possible to prevent light generated in the light emitting layer 12 from being irradiated toward the driver's seat.

The technical scope of the present invention is not limited to the above-described embodiment, and modifications can be added as necessary without departing from the spirit of the present invention. For example, in the above-described embodiment, a configuration in which the vehicle light fixture 100 is disposed in the rear window 4 has been described as an example. However, the present invention is not limited to the above. The vehicle light fixture 100 may be disposed at a position different from the rear window 4, such as a rear portion of the vehicle body 1 or a front portion of the vehicle body 1, for example.

Further, in the above-described embodiment, a configuration in which the vehicle light fixture 100 is disposed in an area including the lower side of the rear window 4 has been described as an example. However, the present invention is not limited to the above. The vehicle light fixture 100 may be disposed, for example, in each of areas including the left side and the right side of the rear window 4, or may be disposed in an area including the upper side of the rear window 4.

Further, in the above-described embodiment, a configuration in which the segment 12S is partitioned in association with the light emitting area 12R has been described as an example. However, the present invention is not limited to the above. The segment 12S may be partitioned in any area of the light emitting layer 12.

Further, in the above-described embodiment, a case has been described in which the segment 12S for emitting light is not changed in each of the light emitting states LS1 to LS4. However, the present invention is not limited to the above. The lighting control unit 21 may form a light emitting state in which the segment 12S for emitting light changes. For example, in a case where the light emitting layer 12 is set in the light emitting state LS1, the segment 12S disposed at a central portion in the left-right direction is caused to emit light first, and the number of segment 12S that are caused to emit light toward the left and right from the central portion may be gradually increased. This makes it possible to form the light emitting state LS1 in such a way as to spread to the left and right from the central portion of the light emitting layer 12, and improve the appearance.

Further, in the above-described embodiment, a configuration in which the rear door 3 and the rear window 4 are formed as separate members has been described as an example. However, the present invention is not limited to the above. For example, the rear door 3 and the rear window 4 may be integrally molded of resin or the like. Also in the rear door 3 and the rear window 4 having such a configuration, the vehicle light fixture 100 can be disposed in the same manner as in the above-described embodiment.

DESCRIPTION OF REFERENCE NUMERALS

A1, A2, A3, A4 Lighting area
B2, B3, B4 Off area
M Vehicle
S1 First segment

S2 Second segment
LS1, LS2, LS3, LS4 Light emitting state
1 Vehicle body
2 Traveling device
3 Rear door
4 Rear window
4a Surface
4b Lower side
4c Left side
4d Right side
5 Gradation area
10 Light source
11, 31 Base portion
11b End edge
12 Light emitting layer
12R Light emitting area
12S Segment
12T Unit light emitting layer
13 Electrode
14 Outer peripheral electrode
15 Segment electrode
15a First segment electrode
15b Second segment electrode
15c, 15d Connecting portion
20 Control unit
21 Lighting control unit
22 Storage unit
30 Light shielding portion
32 Light shielding pattern
100 Vehicle light fixture

The invention claimed is:

1. A vehicle light fixture comprising:
one light source including a base layer, a light emitting layer positioned on a front face of the base layer, an outer peripheral electrode positioned on an outer peripheral side of the front face of the base layer with respect to the light emitting layer, the light emitting layer being partitioned into a plurality of segments capable of emitting light individually; and
a control unit for causing the light emitting layer to emit light in a different light emitting state by performing control of selecting the segment for emitting light from among the plurality of segments, and control of at least one of a brightness and a light emission timing of the selected segment,
wherein the plurality of segments includes a first segment and a second segment,
wherein the light source includes a first segment electrode extending from the first segment to the outer peripheral electrode and a second segment electrode extending from the second segment to the outer peripheral electrode such that the control unit causes the first segment to emit the light in the different light emitting state from the light emitted by the second segment,
wherein the light source is disposed in an area along an outer periphery of a rear window of a vehicle,
wherein the plurality of segments are partitioned to align in an outer peripheral direction being a direction in which the outer periphery of the rear window extends,
wherein the rear window includes a gradation area in which a hue of the vehicle gradually decreases from the outer periphery toward an inside, and
wherein the light emitting layer is formed in such a way that a light emission amount gradually decreases from the outer periphery of the rear window toward the inside in association with the gradation area.

2. The vehicle light fixture according to claim 1, wherein the light emitting layer is formed by using an organic electroluminescence material.

3. The vehicle light fixture according to claim 1, wherein
a first connecting portion of the first segment electrode is disposed at one end of the first segment electrode in the outer peripheral direction, and
a second connecting portion of the second segment electrode is disposed at an other end of the second segment electrode in the outer peripheral direction.

4. The vehicle light fixture according to claim 1, wherein the outer peripheral electrode is disposed on an outer peripheral side of the rear window with respect to the light emitting layer in an extending state in the outer peripheral direction.

5. The vehicle light fixture according to claim 1, further comprising a light shielding portion for covering an area of the light source where the light emitting layer is formed to prevent the light emitted from the light emitting layer from being irradiated toward a driver's seat of the vehicle.

6. The vehicle light fixture according to claim 5, wherein the light emitting layer includes a plurality of unit light emitting layers having a predetermined shape, and the light shielding portion includes a light shield pattern to block the light emitting from the light emitting layer, the light shielding portion being formed in the predetermined shape.

7. The vehicle light fixture according to claim 6, wherein the predetermined shape of the plurality of unit light emitting layers and the light shielding portion is triangular, circular, or elliptical.

8. The vehicle light fixture according to claim 1, wherein
the light emitting layer includes a plurality of unit light emitting layers, the light emitting layer being formed such that an area of the unit light emitting layers gradually decreases from the outer peripheral side of the front face toward the inside, and
each of the plurality of segments is set in a range including the plurality of unit light emitting layers.

9. The vehicle light fixture according to claim 8, wherein a distance between adjacent ones of the plurality of unit light emitting layers gradually increases from the outer peripheral side of the front face toward the inside.

* * * * *